(12) United States Patent
Du et al.

(10) Patent No.: US 12,490,490 B2
(45) Date of Patent: Dec. 2, 2025

(54) NITRIDE-BASED SEMICONDUCTOR DEVICE AND METHOD FOR MANUFACTURING THE SAME

(71) Applicant: INNOSCIENCE (SUZHOU) TECHNOLOGY CO., LTD., Suzhou (CN)

(72) Inventors: Weixing Du, Suzhou (CN); Jheng-Sheng You, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 57 days.

(21) Appl. No.: 17/440,203

(22) PCT Filed: Jul. 16, 2021

(86) PCT No.: PCT/CN2021/106916
§ 371 (c)(1),
(2) Date: Jan. 19, 2023

(87) PCT Pub. No.: WO2023/283955
PCT Pub. Date: Jan. 19, 2023

(65) Prior Publication Data
US 2023/0369423 A1 Nov. 16, 2023

(51) Int. Cl.
*H10D 64/00* (2025.01)
*H01L 23/31* (2006.01)
(Continued)

(52) U.S. Cl.
CPC ....... *H10D 64/117* (2025.01); *H01L 23/3171* (2013.01); *H10D 30/475* (2025.01); *H10D 62/8503* (2025.01)

(58) Field of Classification Search
CPC .......... H10D 30/471–478; H10D 64/111–117; H10D 62/115; H01L 29/778;
(Continued)

(56) References Cited

U.S. PATENT DOCUMENTS

| | | |
|---|---|---|
| 9,502,548 B1 | 11/2016 | Liao |
| 2003/0183886 A1 | 10/2003 | Inoue et al. |

(Continued)

FOREIGN PATENT DOCUMENTS

| | | | | |
|---|---|---|---|---|
| CN | 106298882 A | * | 1/2017 | .......... H10D 30/015 |
| CN | 209199943 U | * | 8/2019 | |

(Continued)

OTHER PUBLICATIONS

State Intellectual Property Office of the People's Republic of China, Office Action and Search Report Issued in Application No. 202180004532.0, Jan. 18, 2023, 16 pages. (Submitted with Machine Translation).

(Continued)

*Primary Examiner* — Lauren R Bell
(74) *Attorney, Agent, or Firm* — McCoy Russell LLP

(57) ABSTRACT

A semiconductor device includes a first nitride-based semiconductor layer, a second nitride-based semiconductor layer, a source electrode and a drain electrode, a gate structure, a first passivation layer, a second passivation layer and a field
(Continued)

plate. The second nitride-based semiconductor layer is disposed on the first nitride-based semiconductor layer. The source electrode, the drain electrode, and the gate structure are disposed above the second nitride-based semiconductor layer. The first passivation layer is disposed above the second nitride-based semiconductor layer and covers the gate structure. The second passivation layer is disposed above the first passivation layer and in a region between the source and drain electrodes. The field plate is disposed above the second passivation layer and in the region between the source electrode and drain electrode, in which the field plate contacts at least one enclosed air gap above the first passivation layer.

19 Claims, 12 Drawing Sheets

(51) Int. Cl.
  *H10D 30/47* (2025.01)
  *H10D 62/85* (2025.01)
(58) Field of Classification Search
  CPC . H01L 29/0649; H01L 29/402; H01L 29/404; H01L 29/405; H01L 29/407
  See application file for complete search history.

(56) References Cited

U.S. PATENT DOCUMENTS

| | | | |
|---|---|---|---|
| 2008/0087916 A1* | 4/2008 | Amasuga | H10D 62/115 |
| | | | 257/E21.445 |
| 2008/0108189 A1 | 5/2008 | Tabatabaie | |
| 2010/0025737 A1* | 2/2010 | Ishikura | H10D 30/87 |
| | | | 257/213 |
| 2013/0069173 A1 | 3/2013 | Chang et al. | |
| 2021/0043744 A1* | 2/2021 | Takeuchi | H10D 64/518 |
| 2021/0126120 A1* | 4/2021 | Piedra | H10D 64/256 |
| 2022/0102344 A1* | 3/2022 | Then | H10D 62/119 |

FOREIGN PATENT DOCUMENTS

| | | |
|---|---|---|
| CN | 111509041 A | 8/2020 |
| CN | 111613665 A | 9/2020 |
| CN | 112993019 A | 6/2021 |
| JP | 2012028579 A | 2/2012 |
| WO | WO-2022030081 A1 * | 2/2022 ........... H10D 64/691 |

OTHER PUBLICATIONS

International Search Report and Written Opinion of the corresponding PCT application No. PCT/CN2021/106916 mailed on Apr. 13, 2022.

* cited by examiner

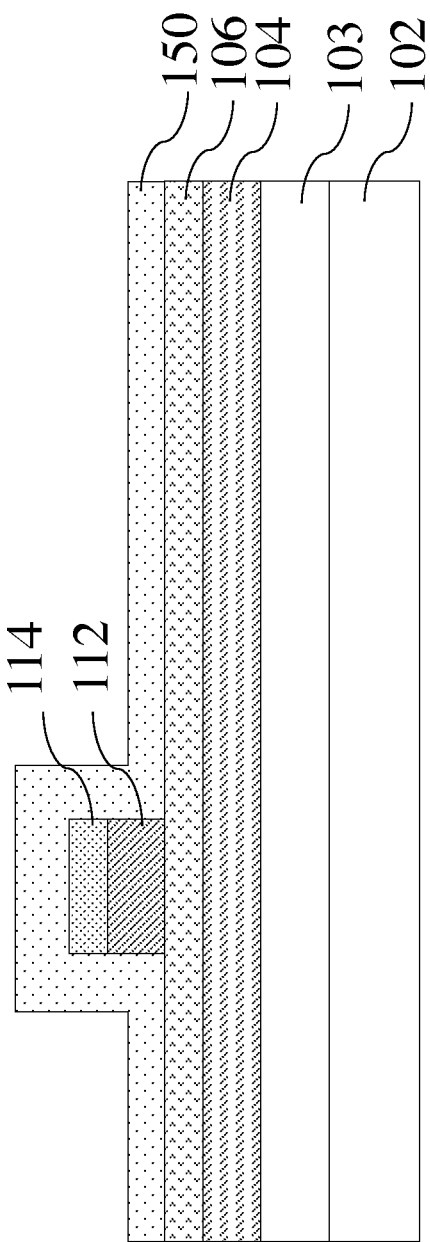
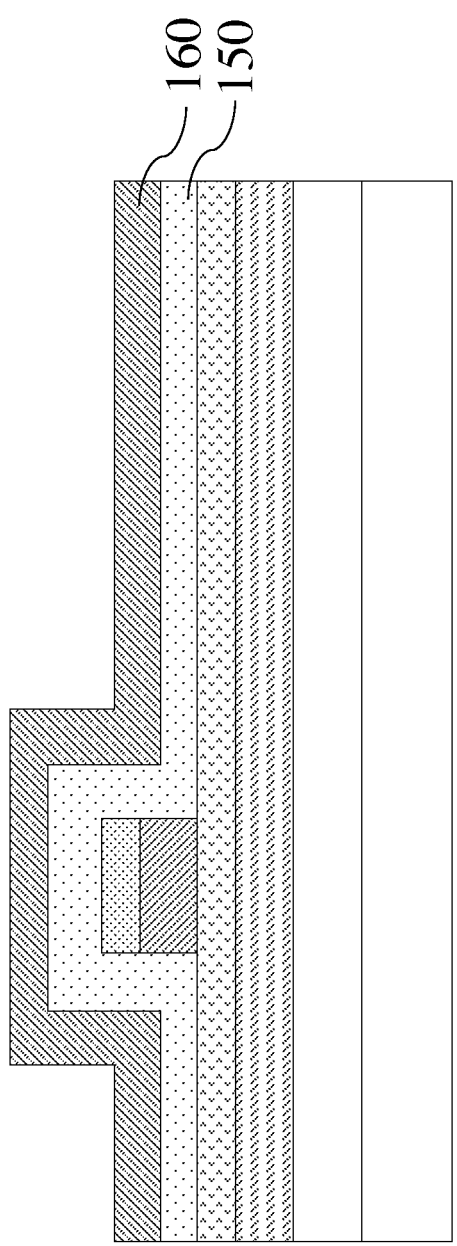
FIG. 2A
FIG. 2B

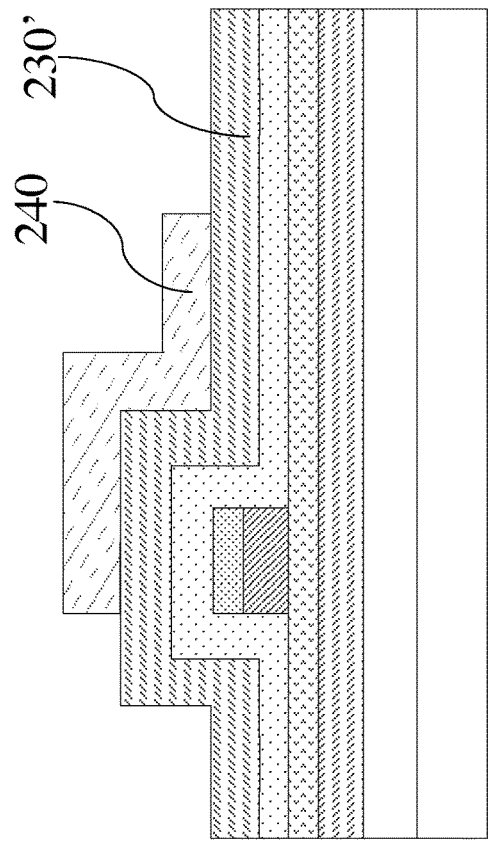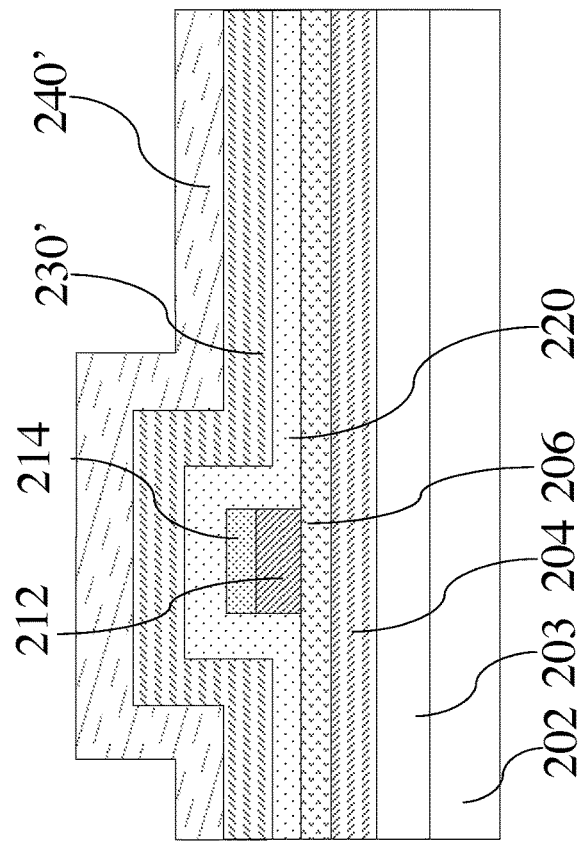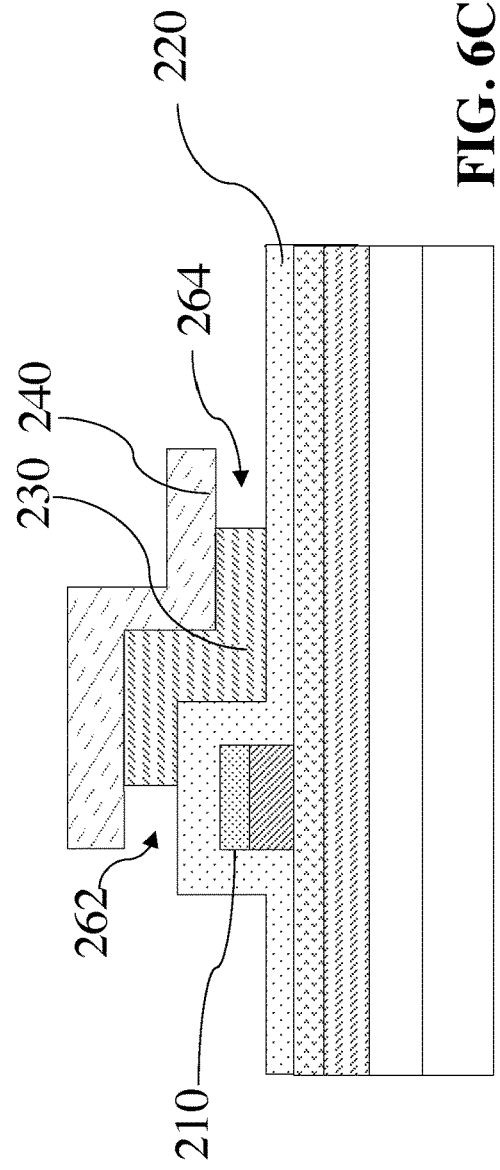
FIG. 6B
FIG. 6A
FIG. 6C

NITRIDE-BASED SEMICONDUCTOR DEVICE AND METHOD FOR MANUFACTURING THE SAME

FIELD OF THE DISCLOSURE

The present disclosure generally relates to a nitride-based semiconductor device. More specifically, the present disclosure relates to a nitride-based semiconductor device having a field plate in collaboration with an air gap, thereby reducing manufacturing costs and improving electrical properties and reliability thereof.

BACKGROUND

In recent years, intense research on high-electron-mobility transistors (HEMTs) has been prevalent, particularly for high power switching and high frequency applications. III-nitride-based HEMTs utilize a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET).

In order to avoid the breakdown phenomenon induced by strong peak electric field near the gate edge which limits the device performance, one approach to lower the peak of the electric field is to utilize multiple field plates to split the electric field into more peaks so as to achieve a more uniform electric field distribution. However, such a configuration would encounter lower yield rates and reliability issues due to the complexity of the manufacturing process thereof. Moreover, excessive numbers of field plates may induce unwanted parasitic/stray capacitances affecting the operating frequency of the device.

SUMMARY

In accordance with one aspect of the present disclosure, a semiconductor device is provided. The semiconductor device includes a first nitride-based semiconductor layer, a second nitride-based semiconductor layer, a source electrode and a drain electrode, a gate structure, a passivation layer, and a field plate. The second nitride-based semiconductor layer is disposed on the first nitride-based semiconductor layer and has a bandgap greater than a bandgap of the first nitride-based semiconductor layer. The source electrode and the drain electrode are disposed above the second nitride-based semiconductor layer. The gate structure is disposed above the second nitride-based semiconductor layer and between the source and drain electrodes. The passivation layer is disposed above the second nitride-based semiconductor layer and covers the gate structure and has an enclosed air gap between the gate structure and the drain electrode. The field plate is disposed above the passivation layer and has a first portion directly over the gate structure and a second portion directly over the air gap. The second portion is separated from the air gap by at least one dielectric of the passivation layer.

In accordance with one aspect of the present disclosure, a method for manufacturing a semiconductor device is provided. The method includes steps as follows. A first nitride-based semiconductor layer is formed. A second nitride-based semiconductor layer is formed on the first nitride-based semiconductor layer. A gate structure is formed above the second nitride-based semiconductor layer. A first passivation layer is formed above the second nitride-based semiconductor layer to cover the gate structure. An oxide strip is formed on the first passivation layer. A second passivation layer is formed above the first passivation layer to cover the oxide strip. The oxide strip is removed to form a tunnel between the first and second passivation layers. A field plate is formed above the second passivation layer and vertically overlaps with the tunnel.

In accordance with one aspect of the present disclosure, a semiconductor device is provided. The semiconductor device includes a first nitride-based semiconductor layer, a second nitride-based semiconductor layer, a source electrode and a drain electrode, a gate structure, a passivation layer, and a field plate. The second nitride-based semiconductor layer is disposed on the first nitride-based semiconductor layer and has a bandgap greater than a bandgap of the first nitride-based semiconductor layer. The source electrode and the drain electrode are disposed above the second nitride-based semiconductor layer. The gate structure is disposed above the second nitride-based semiconductor layer and between the source and drain electrodes. The passivation layer is disposed above the second nitride-based semiconductor layer and covers the gate structure and has an enclosed tunnel between the gate structure and the drain electrode. The tunnel extends laterally to a first position which is spaced apart from the drain electrode by a first vertical distance. The field plate is disposed above the passivation layer and has a first portion directly over the gate structure and a second portion directly over the air gap. The second portion extends laterally to a second position which is spaced apart from the drain electrode by a second vertical distance. The first vertical distance is less than the second vertical distance.

In accordance with one aspect of the present disclosure, a semiconductor device is provided. The semiconductor device includes a first nitride-based semiconductor layer, a second nitride-based semiconductor layer, a source electrode and a drain electrode, a gate structure, a first passivation layer, a second passivation layer and a field plate. The second nitride-based semiconductor layer is disposed on the first nitride-based semiconductor layer and has a bandgap greater than a bandgap of the first nitride-based semiconductor layer. The source electrode and the drain electrode are disposed above the second nitride-based semiconductor layer. The gate structure is disposed above the second nitride-based semiconductor layer and between the source and drain electrodes. The first passivation layer is disposed above the second nitride-based semiconductor layer and covers the gate structure. The second passivation layer is disposed above the first passivation layer and in a region between the source and drain electrodes. The field plate is disposed above the second passivation layer and in the region between the source electrode and drain electrode, in which the field plate contacts at least one enclosed air gap above the first passivation layer.

In accordance with one aspect of the present disclosure, a method for manufacturing a semiconductor device is provided. The method includes steps as follows. A first nitride-based semiconductor layer is formed. A second nitride-based semiconductor layer is formed on the first nitride-based semiconductor layer. A gate structure is formed above the second nitride-based semiconductor layer. A first passivation layer is formed above the second nitride-based semiconductor layer to cover the gate structure. A second passivation layer is formed above the first passivation layer. A blanket conductive layer is formed on the second passivation layer. The blanket conductive layer is patterned into a field plate. A plurality of portions of the second passivation layer are removed such that the second passivation layer becomes narrower than the field plate. A third passivation layer is formed to cover the first passivation layer and the field plate to form at least one enclosed air gap adjacent with the second passivation layer.

In accordance with one aspect of the present disclosure, a semiconductor device is provided. The semiconductor device includes a first nitride-based semiconductor layer, a second nitride-based semiconductor layer, a source electrode and a drain electrode, a gate structure, a first passivation layer, a second passivation layer, a third passivation layers and a field plate. The second nitride-based semiconductor layer is disposed on the first nitride-based semiconductor layer and has a bandgap greater than a bandgap of the first nitride-based semiconductor layer. The source electrode and the drain electrode are disposed above the second nitride-based semiconductor layer. The gate structure is disposed above the second nitride-based semiconductor layer and between the source and drain electrodes. The first passivation layer is disposed above the second nitride-based semiconductor layer and covers the gate structure. The second passivation layer is disposed above the first passivation layer and in a region between the source and drain electrodes. The field plate is disposed above the second passivation layer and in the region between the source and drain electrodes. The third passivation layer is disposed above the first passivation layer and covers the field plate which contacts at least one enclosed air gap embedded between the second and third passivation layers.

By the above configuration, in the embodiments of the present disclosure, the semiconductor device adopts a design of a single field plate in collaboration with an air gap. The introduction of the air gap can assist the field plate to collectively make the electric field distribution in the semiconductor device uniform, thereby significantly reducing the complexity of the manufacturing process thereof and the times of using the etching process. Therefore, unexpected surface/sidewall damage can be avoided since the number of the etching process is decreased. Accordingly, the manufacturing cost of the semiconductor device can be reduced and the reliability thereof can be improved. Moreover, the configuration of the air gap can lead a reduction in the parasitic capacitances and the resistance of a zone of the 2DEG region directly thereunder, and thus the electrical properties of the semiconductor device can be enhanced.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which:

FIG. 2A, FIG. 2B, FIG. 2C, FIG. 2D, FIG. 2E and FIG. 2F show different stages of a method for manufacturing a nitride-based semiconductor device according to some embodiments of the present disclosure;

FIG. 6A, FIG. 6B and FIG. 6C show different stages of a method for manufacturing a nitride-based semiconductor device according to some embodiments of the present disclosure;

DETAILED DESCRIPTION

Figure 1A:
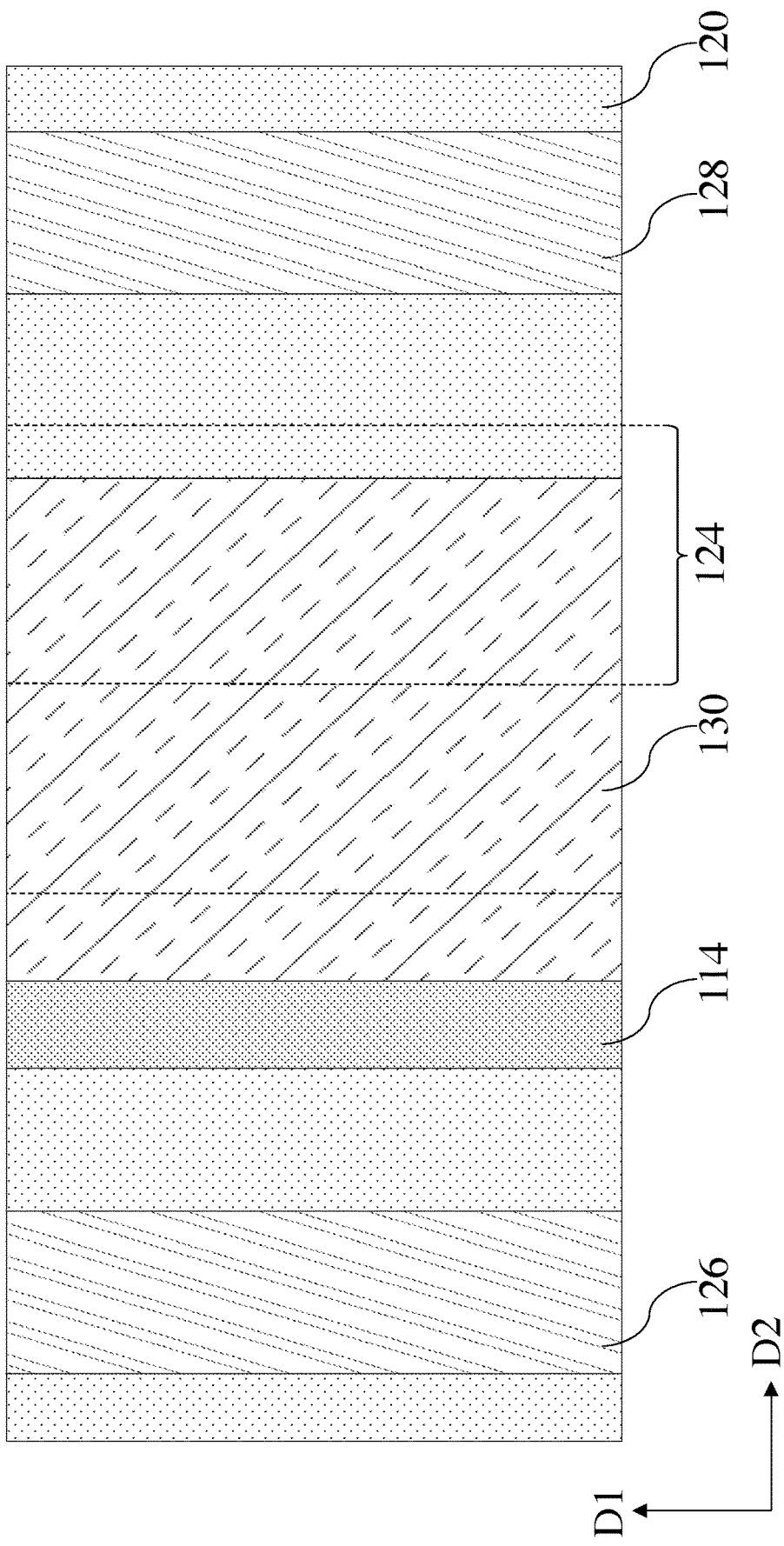
FIG. 1A is a top view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "on," "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

Figure 1B:
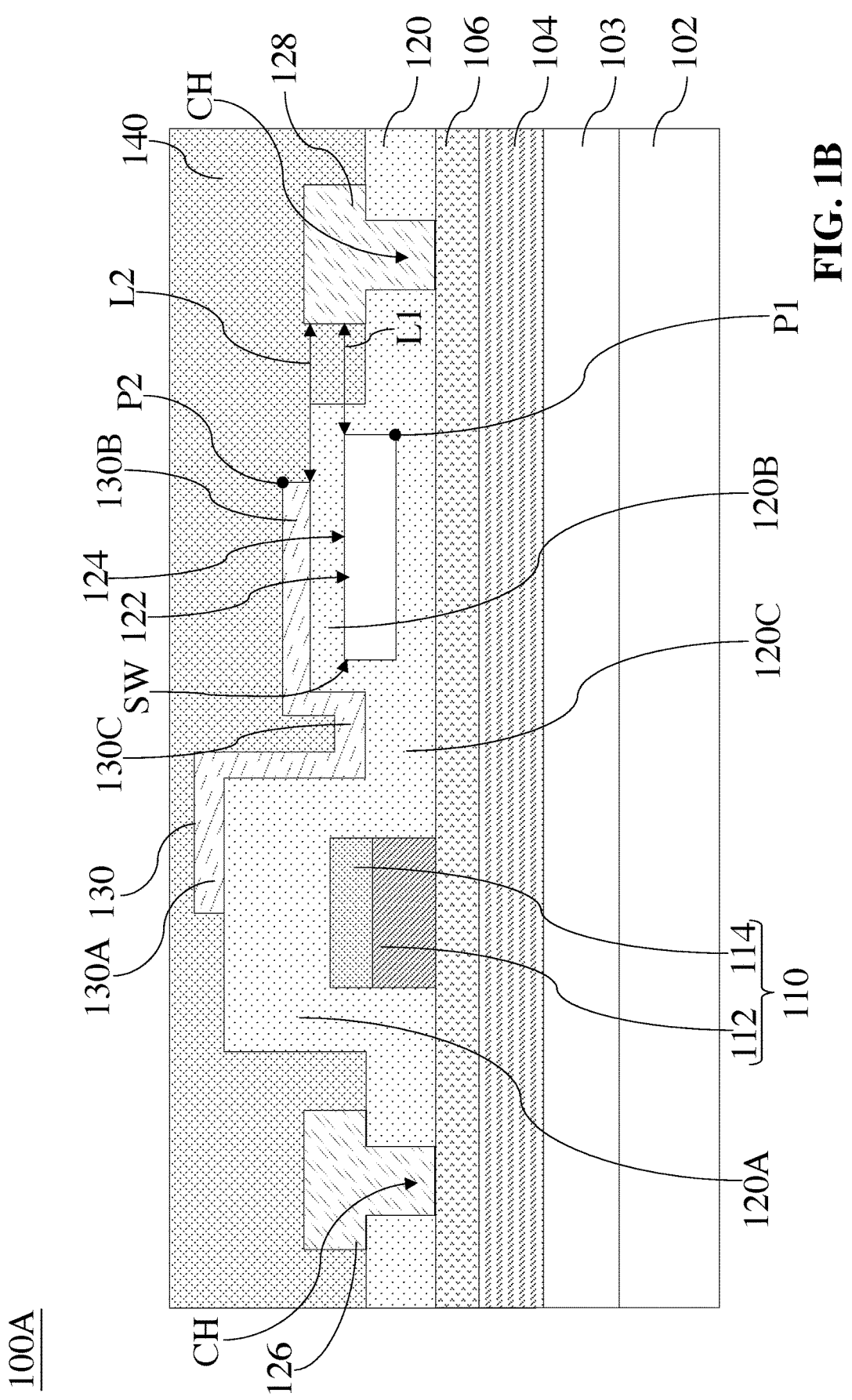
FIG. 1B is a vertical cross-sectional view of the semiconductor device.

FIG. 1A is a top view of a semiconductor device 100A according to some embodiments of the present disclosure. FIG. 1B is a vertical cross-sectional view of the semiconductor device 100A. In order to make the description clear, directions D1 and D2 are labeled in FIG. 1A, which are different than each other. The direction D1 is perpendicular to the direction D2. The semiconductor device 100A includes a substrate 102, a buffer layer 103, nitride-based semiconductor layers 104 and 106, a gate structure 110, a passivation layer 120, electrodes 126 and 128, a field plate 130 and a passivation layer 140.

The substrate 102 may be a semiconductor substrate. The exemplary materials of the substrate 102 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 102 can include, for example, but is not limited to, group III elements, group IV elements, group V elements, or combinations thereof (e.g., III-V compounds). In other embodiments, the substrate 102 can include, for example but is not limited to, one or more other features, such as a doped region, a buried layer, an epitaxial (epi) layer, or combinations thereof.

The buffer layer 103 can be disposed on/over/above the substrate 102. The buffer layer 103 can be configured to reduce lattice and thermal mismatches between the substrate 102 and the nitride-based semiconductor layer 104, thereby curing defects due to the mismatches/difference. The buffer layer 103 may include a III-V compound. The III-V compound can include, for example but are not limited to, aluminum, gallium, indium, nitrogen, or combinations thereof. Accordingly, the exemplary materials of the buffer layer 103 can further include, for example but are not limited to, GaN, AlN, AlGaN, InAlGaN, or combinations thereof. In some embodiments, the semiconductor device 100A may further include a nucleation layer (not shown). The nucleation layer may be formed between the substrate 102 and the buffer layer 103. The nucleation layer can be configured to provide a transition to accommodate a mismatch/difference between the substrate 102 and a III-nitride layer of the buffer layer. The exemplary material of the nucleation layer can include, for example but is not limited to AlN or any of its alloys. In some embodiments, the buffer layer 103 can be omitted, the disclosure is not limited thereto.

The nitride-based semiconductor layer 104 is disposed on/over/above the buffer layer 103 (or the substrate 102). The nitride-based semiconductor layer 106 is disposed on the nitride-based semiconductor layer 104. The exemplary materials of the nitride-based semiconductor layer 104 can include, for example but are not limited to, nitrides or group III-V compounds, such as GaN, AlN, InN, $In_xAl_yGa_{(1-x-y)}N$ where $x+y \leq 1$, $Al_yGa_{(1-y)}N$ where $y \leq 1$. The exemplary materials of the nitride-based semiconductor layer 106 can include, for example but are not limited to, nitrides or group III-V compounds, such as GaN, AlN, InN, $In_xAl_yGa_{(1-x-y)}N$ where $x+y \leq 1$, $Al_yGa_{(1-y)}N$ where $y \leq 1$.

The exemplary materials of the nitride-based semiconductor layers 104 and 106 are selected such that the nitride-based semiconductor layer 106 has a bandgap (i.e., forbidden band width) greater than a bandgap of the nitride-based semiconductor layer 104, which causes electron affinities thereof different from each other and forms a heterojunction therebetween. For example, when the nitride-based semiconductor layer 104 is an undoped GaN layer having a bandgap of approximately 3.4 eV, the nitride-based semiconductor layer 106 can be selected as an AlGaN layer having bandgap of approximately 4.0 eV. As such, the nitride-based semiconductor layers 104 and 106 can serve as a channel layer and a barrier layer, respectively. A triangular well potential is generated at a bonded interface between the channel and barrier layers, so that electrons accumulate in the triangular well, thereby generating a two-dimensional electron gas (2DEG) region adjacent to the heterojunction. Accordingly, the semiconductor device 100A is available to include at least one GaN-based high-electron-mobility transistor (HEMT).

The gate structure 110 is disposed on/over/above the nitride-based semiconductor layer 106. The gate structure 110 includes a doped III-V semiconductor layer 112 and a gate electrode 114. The doped III-V semiconductor layer 112 is disposed on and in contact with the nitride-based semiconductor layer 106. The doped III-V semiconductor layer 112 is disposed/sandwiched between the nitride-based semiconductor layer 106 and the gate electrode 114. The gate electrode 114 is disposed on and in contact with the doped III-V semiconductor layer 112. In the exemplary illustration of FIG. 1A, a width of the doped III-V semiconductor layer 112 is substantially the same as that of the gate electrode 114. In some embodiments, a width of the doped III-V semiconductor layer 112 is greater than that of the gate electrode 114. The profiles of the doped III-V semiconductor layer 112 and the gate electrode 114 are the same. For example, both of the doped III-V semiconductor layer 112 and the gate electrode 114 have rectangular profiles. In other embodiments, the profiles of the doped III-V semiconductor layer 112 and the gate electrode 114 can be different from each other. For example, the profile of the doped III-V semiconductor layer 112 can be a trapezoid profile, and the profile of the gate electrode 114 can be a rectangular profile.

In the exemplary illustration of FIG. 1B, the semiconductor device 100A is an enhancement mode device, which is in a normally-off state when the gate electrode 114 is at approximately zero bias. Specifically, the doped III-V semiconductor layer 112 may create at least one p-n junction with the nitride-based semiconductor layer 106 to deplete the 2DEG region, such that at least one zone of the 2DEG region corresponding to a position below the corresponding the gate electrode 114 has different characteristics (e.g., different electron concentrations) than the rest of the 2DEG region and thus is blocked. Due to such mechanism, the semiconductor device 100A has a normally-off characteristic. In other words, when no voltage is applied to the gate electrode 114 or a voltage applied to the gate electrode 114 is less than a threshold voltage (i.e., a minimum voltage required to form an inversion layer below the gate electrode 114), the zone of the 2DEG region below the gate electrode 114 is kept blocked, and thus no current flows therethrough.

In some embodiments, the doped III-V semiconductor layer 112 can be omitted, such that the semiconductor device 100A is a depletion-mode device, which means the semiconductor device 100A in a normally-on state at zero gate-source voltage.

The doped III-V semiconductor layer 112 can be a p-type doped III-V semiconductor layer. The exemplary materials of the doped III-V semiconductor layer 112 can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Zn, Cd, and Mg. In some embodiments, the nitride-based semiconductor layer 104 includes undoped GaN and the nitride-based semiconductor layer 106 includes AlGaN, and the doped III-V semiconductor layer 112 is a p-type GaN layer which can bend the underlying band structure upwards and to deplete the corresponding zone of the 2DEG region, so as to place the semiconductor device 100A into an off-state condition.

The exemplary materials of the gate electrode 114 may include metals or metal compounds. The gate electrode 114 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, metal alloys or compounds thereof, or other metallic compounds.

The passivation layer 120 can be disposed on/over/above the nitride-based semiconductor layer 106 and the gate structure 110. The passivation layer 120 includes a plurality of contact holes CH. The passivation layer 120 can cover the gate structure 110. The passivation layer 120 can be conformal with the gate structure 110. Furthermore, the passivation layer 120 has an enclosed air gap 122 (e.g., a vacuum gap or a void). The passivation layer 120 can include at least one dielectric material. Once a dielectric material is applied to the formation of the passivation layer 120, the air gap 122 becomes embedded in the dielectric.

To be more specific, the passivation layer 120 includes portions 120A, 120B and 120C. The portion 120C is located between the portions 120A and 120B (i.e., the portion 120A is opposite to the portion 120B). The portion 120C connects the portions 120A and 120B. The portion 120C extends laterally between the portions 120A and 120B. The portion 120A of the passivation layer 120 is conformally disposed with and directly over the gate structure 110. The portions 120A and 120B can protrude out the portion 120C. Specifically, the portion 120A is in a position higher than the portion 120B, and the portion 120B is in a position higher than the portion 120C. Since the portions 120A and 120B at higher positions can be referred to as the protruding portions, the portion 120C at a lower position can be referred to as a recess portion.

The portion 120B of the passivation layer 120 has the air gap 122. The portion 120B of the passivation layer 120 has an inner sidewall SW (i.e., inner boundary/border) to define a tunnel 124 in which the enclosed air gap 122 is located. Herein, the "tunnel" includes a passage that extends in a linear manner. For example, the gate electrode 114 and the doped III-V semiconductor layer 112 are formed as strips extending along the first direction D1 in the top view (e.g., FIG. 1A), and the tunnel 124 extends along the first direction D1 and thus is parallel with the strips. The tunnel 124 is filled with the air gap 122. Since the inner sidewall SW is inside the portion 120B, the tunnel 124 has a width less than that of the portion 120B of the passivation layer 120. The inner sidewall SW is spaced apart from the surfaces of the passivation layer 120 by the dielectric material of the passivation layer 120. In some embodiments, the air gap 122 is fully surrounded and thus is embedded in the single dielectric material. Accordingly, the air gap 122 is separated from the other element layers (e.g., the gate structure 110, the electrodes 126 and 128, and the nitride-based semiconductor layer 106) by the dielectric of the passivation layer 120.

In some embodiments, the air gap 122 may contain oxygen. In this regard, since the air gap 122 is isolated by the dielectric of the passivation layer 120, the oxygen therein would not oxidize other element layers. Accordingly, the selection for the gas contained in the air gap 122 is flexible.

In some embodiments, the tunnel 124 can be formed by a selective etching process. Prior to the selective etching process, a filler is embedded into the passivation layer 120, such as an oxide filler. During the selective etching process, the filler is removed and the passivation layer 120 is free from the removal. According to different process conditions, there may be at least one residue of the filler accommodated in the tunnel 124 and adhered to the inner sidewall SW. In some embodiments, the residue can be detected as having an oxygen element.

The material of the passivation layer 120 can include, for example but are not limited to, dielectric materials. For example, the passivation layer 120 can include, for example but are not limited to, silicon nitride, such as $SiN_x$, $Si_3N_4$, SiON, SiBN, SiCBN or combinations thereof. In embodiments involving the residue adhering to the inner sidewall SW, the materials of the passivation layer 120 and the residue may have different etching rate with respect to the same etchant.

In some embodiments, the electrode 126 can serve as a source electrode. In some embodiments, the electrode 126 can serve as a drain electrode. In some embodiments, the electrode 128 can serve as a source electrode. In some embodiments, the electrode 128 can serve as a drain electrode. In some embodiments, each of the electrodes 126 and 128 can be called a source/drain (S/D) electrode, which means they can serve as a source electrode or a drain electrode, depending on the device design.

The electrodes 126 and 128 are disposed on/over/above and in contact with the nitride-based semiconductor layer 106. The electrodes 126 and 128 can extend along the direction D1 and thus are parallel to the tunnel 124. The gate electrode 114 and the electrodes 126 and 128 can be arranged along the direction D2. The electrodes 126 and 128 can extend through the contact holes CH of the passivation layer 120 to make contact with the nitride-based semiconductor layer 106. In other words, the electrodes 126 and 128 can penetrate the passivation layer 120. The "S/D" electrode means each of the electrodes 126 and 128 can serve as a source electrode or a drain electrode, depending on the device design.

The doped III-V semiconductor layer 112 and the gate electrode 114 are located between the electrodes 126 and 128. That is, the electrodes 126 and 128 can be located at two opposite sides of the gate electrode 114, respectively. In some embodiments, other configurations may be used, particularly when plural source, drain, or gate electrodes are employed in the device. In the exemplary illustration of FIG. 1B, the electrodes 126 and 128 are asymmetrical about the gate electrode 114. For example, the electrode 126 can be closer to the gate electrode 114 than the electrodes 128. In other embodiments, the electrodes 126 and 128 are symmetrical about the gate electrode 114.

In some embodiments, the electrodes 126 and 128 can include, for example but are not limited to, metals, alloys, doped semiconductor materials (such as doped crystalline silicon), compounds such as silicides and nitrides, other conductor materials, or combinations thereof. The exemplary materials of the electrodes 126 and 128 can include, for example but are not limited to, Ti, AlSi, TiN, or combinations thereof. The electrodes 126 and 128 may be a single layer, or plural layers of the same or different composition. In some embodiments, the electrodes 126 and 128 form ohmic contacts with the nitride-based semiconductor layer 106. The ohmic contacts can be achieved by applying Ti, Al, or other suitable materials to the electrodes 126 and 128. In some embodiments, each of the electrodes 126 and 128 is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

The field plate 130 is conformally disposed on/over/above the passivation layer 120. The field plate 130 can include portions 130A, 130B and 130C. The portion 130C is located between the portions 130A and 130B (i.e., the portion 130A is opposite to the portion 130B). The portion 130C connects the portions 130A and 130B. The portion 130C extends laterally between the portions 130A and 130B. The portion 130A of the field plate 130 is directly over the gate structure 110 and the portion 120A of the passivation layer 120. The portion 120A of the passivation layer 120 is located/sandwiched between the portion 130A of the field plate 130 and the gate structure 110. The portion 130B of the field plate 130 is directly over the air gap 122 and the portion 120B of the passivation layer 120. The portion 120B of the passivation layer 120 is located/sandwiched between the portion 130B of the field plate 130 and the air gap 122. The portion 130B of the field plate 130 is separated from the air gap 122/tunnel 124 by the at least one dielectric of the passivation layer 120.

The portions 130A, 130B and 130C of the field plate 130 are correspondingly disposed with the portions 120A, 120B and 120C of the passivation layer 120, respectively. Due to the height relationship among the portions 120A, 120B and 120C, the portion 130A is in a position higher than the portion 130B, and the portion 130B is in a position higher than the portion 130C. In the exemplary illustration of FIG. 1B, the portions 130A and 130B are in positions higher than that of the gate structure 110 and the air gap 122, and the portion 130C is in a position between the gate structure 110 and the air gap 122. From the far left to the far right, the field plate 130 extends laterally/horizontally, downward, laterally/horizontally, upward and laterally/horizontally in sequence. The portion 130C extends laterally along a path lower than the portions 130A and 130B. The portion 130C extends between the portions 120A and 120B of the passivation layer 120.

The portion 130B of the field plate 130 and the tunnel 124 can extend laterally along the same direction (e.g., the direction D1), as shown in FIG. 1A. The tunnel 124 and the portion 130B of the field plate 130 have an overlapping area/region. The inner sidewall SW has a horizontal distance L1 to the electrode 128. The portion 130B of the field plate 130 has a horizontal distance L2 to the electrode 128. The horizontal distance L1 is less than the horizontal distance L2. From another point of view, the tunnel 124 extends laterally to a position P1 which is spaced apart from the electrode 128 by a vertical distance, which is defined as the shortest distance between the tunnel 124 and the electrode 128. The field plate 130 extends laterally to a position P2 which is spaced apart from the electrode 128 by a vertical distance, which is defined as the shortest between the field plate 130 and the electrode 128. Therefore, the air gap 122 is arranged as being closer to the electrode 128 than the field plate 130.

The materials of the field plate 130 can include, for example but are not limited to, conductive materials, such as Ti, Ta, TiN, TaN, or combinations thereof. In some embodiments, other conductive materials such as Al, Cu doped Si, and alloys including these materials may also be used.

The field plate 130 can change an electric field distribution of the drain region and affect breakdown voltage of the semiconductor device 100A. The field plate 130 suppresses the electric field distribution in the desired region and reduces its peak value. In this regard, the introduction of the air gap 122 can assist the field plate 130 to collectively make the electric field distribution in the semiconductor device 100A uniform.

The enclosed air gap 122 in the tunnel 124 can create a low-k region in the passivation layer 120. The air gap 122 alters the distribution of the dielectric constant inside the semiconductor device 100A which reduces the intensity of the electric field at the edge of the field plate 130 (i.e., the gate-drain side), so as to achieve a higher breakdown electric field. The configuration of the single field plate 130 and the air gap 122 can jointly ameliorate the phenomenon of non-uniform electric field distribution.

Therefore, the single field plate configuration is one possible configuration. Such a configuration would not weaken the effect of reshaping the electric field distribution. The manufacturing cost can be reduced. Also, it can avoid performing extra etching steps which may destroy the surfaces/sidewalls of the element layers. Moreover, reduction of the number of field plates can reduce the probability of generating inter-electrode and electrode-semiconductor parasitic capacitances. Thus, the maximum operating frequency of the semiconductor device 100A can be allowed to get higher.

In order to make the air gap 122 capable of altering the distribution of the dielectric constant for the purpose of reshaping electric field distribution, the air gap 122 is arranged to be closer to the electrode 128 than the field plate 130. Once a semiconductor device has a field plate closer to a drain electrode than an air gap, there will be no air gap beneath the end of the field plate, such that no low-k region is created there. As such, the contribution of the air gap will be lowered.

At least for the purpose of achieving a better match between the electric field distribution and the dielectric constant distribution, the profile/shape of the air gap 122/tunnel 124 can be designed as being in coordination with the morphology of the portion 130B of the field plate 130. In the exemplary illustration of FIG. 1B, the profile of the air gap 122/tunnel 124 can be designed as being a rectangular profile to comply with the morphology of the portion 130B of the field plate 130. In other embodiments, once the portion 130B of the field plate 130 to be formed over the air gap 122/tunnel 124 is designed as being curved, the profile of the air gap 122/tunnel 124 can be designed to have a curve boundary in advance.

Furthermore, the air gap 122, which can include a low-k region, can be disposed between the gate structure 110 and the electrode 128. The air gap 122 can be disposed between the nitride-based semiconductor layer 106 and the field plate 130. Since the capacitance value is positively related to the dielectric constant, the reduction in equivalent dielectric constant of the medium sandwiched between the electrodes (e.g., the gate electrode 114 and the electrode 128) can reduce parasitic capacitance therebetween. Therefore, the operating frequency of the semiconductor device 100A can be allowed to get higher, so as to improve the performance of semiconductor device 100A. In some embodiments, the air gap 122 can be disposed between the gate structure 110 and the electrode 126.

When the semiconductor device 100A works in a relatively high voltage environment, relatively great electric field intensity happens, which may tend to trap channel electrons in the 2DEG region. Such phenomenon is easily observed in the position close to or at the gate edge near the drain side (where impulse or relatively great electric field intensity can occur), which can lead to resistance change of the 2DEG region. The air gap 122 can provide a low-k region to lessen the electric field intensity (inter alia those being close to the gate edge at the drain side), which can further reduce the resistance thereof (also known as sheet resistance, surface resistance or surface resistivity).

The passivation layer 140 is disposed on/over/above the passivation layer 120. The passivation layer 140 covers the passivation layer 120, the electrodes 126 and 128 and the field plate 130. The exemplary material of the passivation layer 140 can be identical with or similar with that of the passivation layer 120. In some embodiments, the passivation layer 140 can serve as a planarization layer which has a level top surface to support other layers/elements. In some embodiments, the passivation layer 140 can be formed as a thicker layer, and a planarization process, such as chemical mechanical polish (CMP) process, is performed on the passivation layer 140 to remove the excess portions, thereby forming a level top surface.

Different stages of a method for manufacturing the semiconductor device 100A are shown in FIG. 2A, FIG. 2B, FIG. 2C, FIG. 2D, FIG. 2E and FIG. 2F as described below. For clarity, manufacturing stages of some element layers such as the electrodes 126 and 128 and the passivation layer 140 is omitted.

In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Referring to FIG. 2A, a substrate 102 is provided. A buffer layer 103, a nitride-based semiconductor layer 104, a nitride-based semiconductor layer 106, a doped nitride-based semiconductor 112, a gate electrode 114 and a passivation layer 150 can be formed over the substrate 102 in sequence by using deposition techniques.

To be more specific, the buffer layer 103 is formed on the substrate 102. The nitride-based semiconductor layer 104 is formed on the buffer layer 103. The nitride-based semiconductor layer 106 is formed on the nitride-based semiconductor layer 104. The doped III-V semiconductor layer 112 is formed on the nitride-based semiconductor layer 106. The gate electrode 114 is formed on the doped III-V semiconductor layer 112. The passivation layer 150 is formed on the nitride-based semiconductor layer 106 to cover the doped III-V semiconductor layer 112, the gate electrode 114 and the nitride-based semiconductor layer 106.

The formation of the doped III-V semiconductor layer 112 and the gate electrode 114 further includes and a patterning process. In some embodiments, the deposition techniques can be performed for forming a blanket layer, and the patterning process can be performed for removing excess portions thereof. In some embodiments, the patterning process can include photolithography, exposure and development, etching, other suitable processes, or combinations thereof.

Referring to FIG. 2B, a blanket oxide layer 160 is formed to cover on the passivation layer 150. The material of the blanket oxide layer 160 can include, for example, silicon dioxide ($SiO_2$).

Figure 2C:
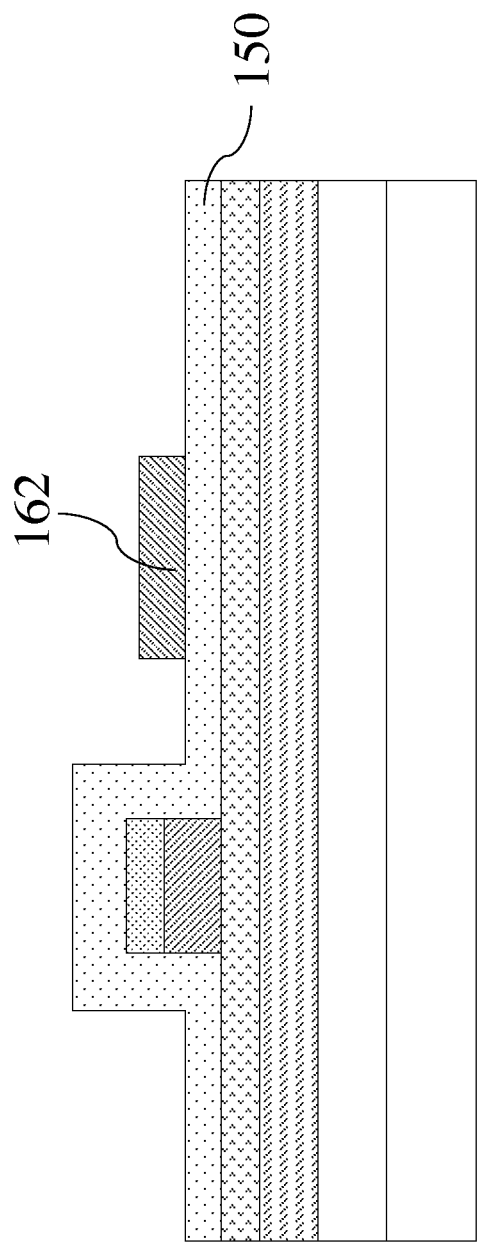

Referring to FIG. 2C, the blanket oxide layer 160 is patterned to remove excess portions thereof, such that an oxide strip 162 is formed on the passivation layer 150.

Figure 2D:
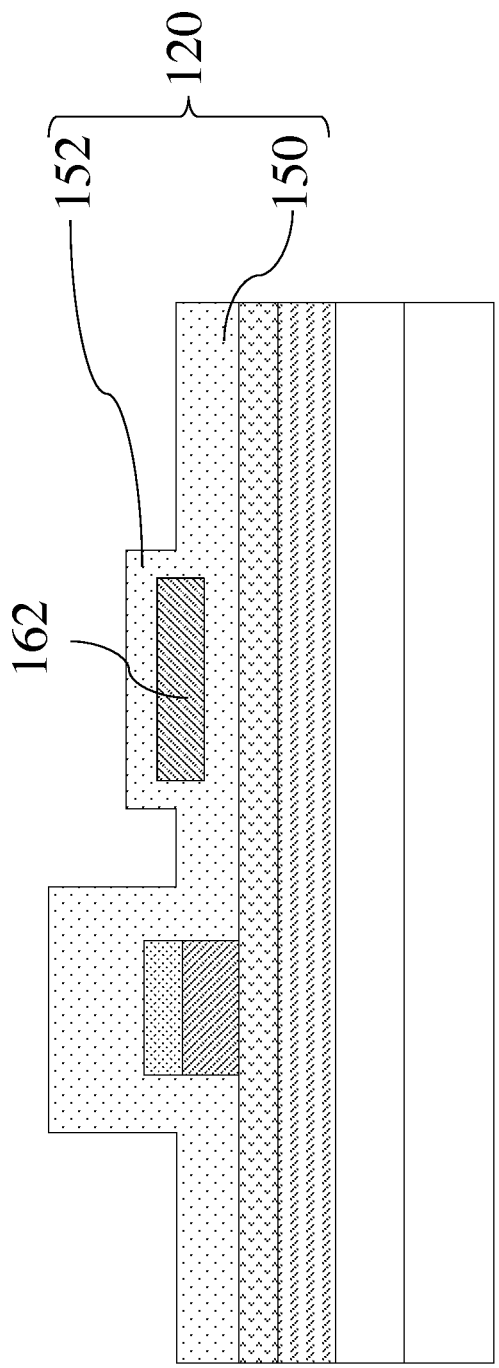

Referring to FIG. 2D, a passivation layer 152 is formed on/over/above the passivation layer 150. In some embodiments, the passivation layers 150 and 152 have the same material. As such, the passivation layers 150 and 152 are merged with each other to form the passivation layer 120.

The passivation layer 150 covers the oxide strip 162 and thus has a protruding portion directly over the oxide strip 162.

Figure 2E:
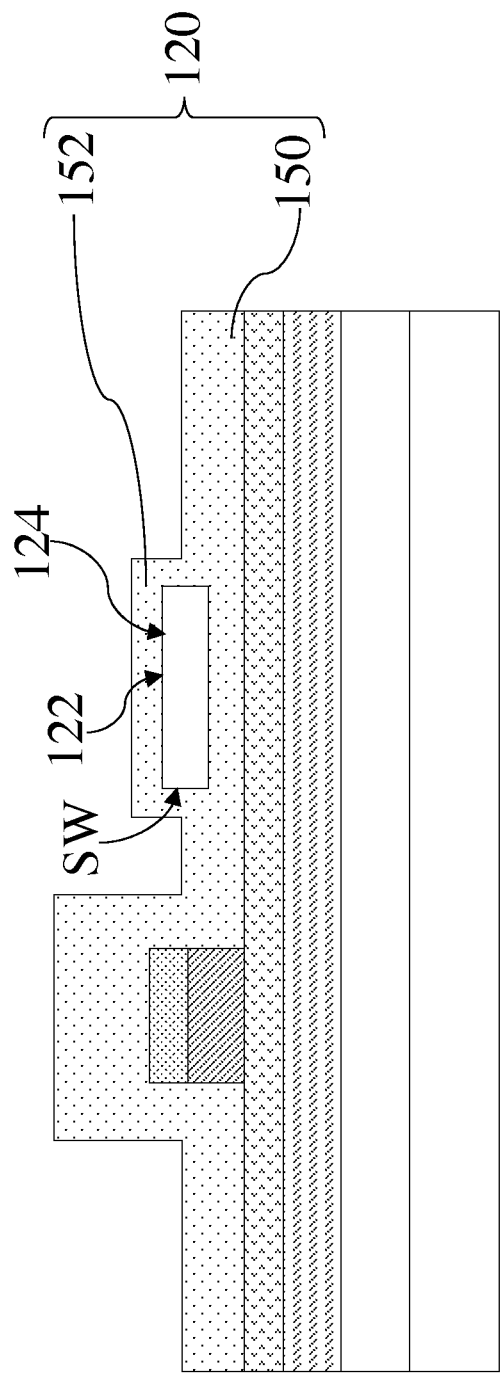

Referring to FIG. 2E, an etching process is performed to remove the oxide strip 162 to form a tunnel 124 between the passivation layers 150 and 152. The etching process includes a selective etching process. For example, as the material of the passivation layers 150 and 152 is selected from silicon nitride, the etchant applied to the etching process can have a higher etching rate with respect to the oxide than that of the silicon nitride. As such, the tunnel 124 is formed with filled with an air gap 122. From the other point of view, the air gap 122 is formed inside the passivation layer 120 or a region between the two stacked passivation layers 150 and 152. In addition, in some embodiments, a small amount of residual oxide which is not etched by the etchant can remain on the inner sidewall SW of the passivation layer 120.

Figure 2F:
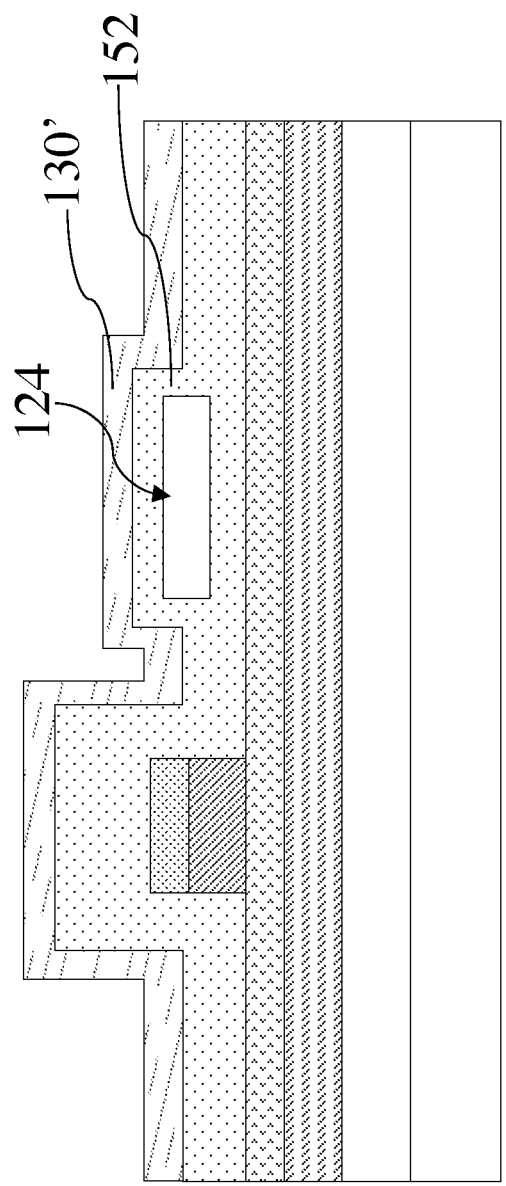

Referring to FIG. 2F, an intermediate field plate 130' is formed on the passivation layer 152. Then, a patterning process can be performed on the intermediate field plate 130' for removing excess portions thereof, such that a field plate 130 is formed above the passivation layer 152 and vertically overlaps with the tunnel 124. Thereafter, a passivation layer 140 can be formed, obtaining the configuration of the semiconductor device 100A as shown in FIG. 1B.

Figure 3:
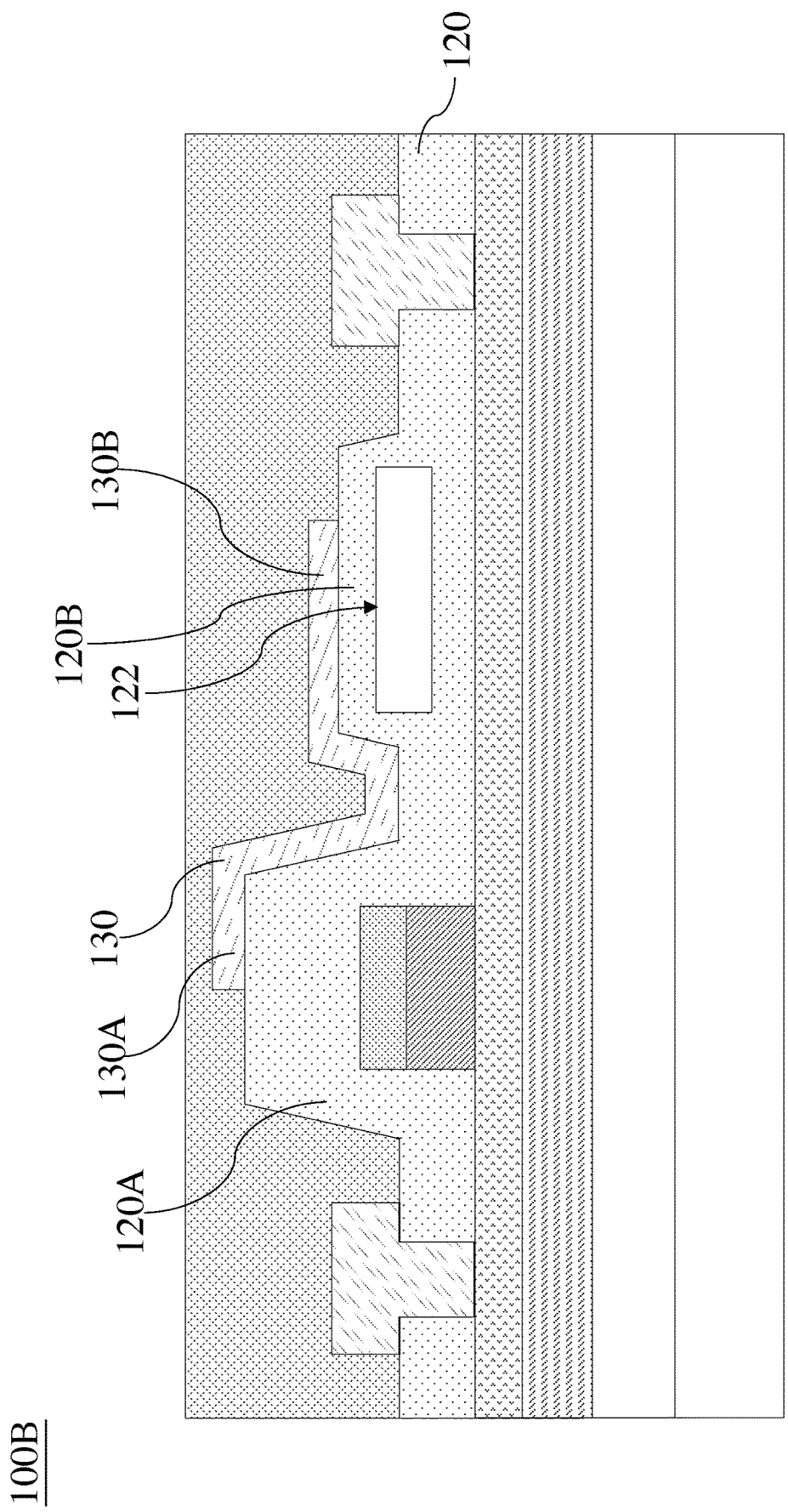
FIG. 3 is a vertical cross-sectional view of a semiconductor device according to some embodiments of the present disclosure.

FIG. 3 is a vertical cross-sectional view of a semiconductor device 100B according to some embodiments of the present disclosure. In the exemplary illustration of FIG. 3, the profiles of the portions 120A and 120B of the passivation layer 120 are trapezoid profiles. Portions 130A and 130B of the field plate 130 can be disposed at an inclined surfaces of the portions 120A and 120B of the passivation layer 120. As such, from the far left to the far right, the field plate 130 can extend laterally, extend obliquely-and-downward, extend laterally, extend obliquely-and-upward, and extend laterally in sequence.

Figure 4:
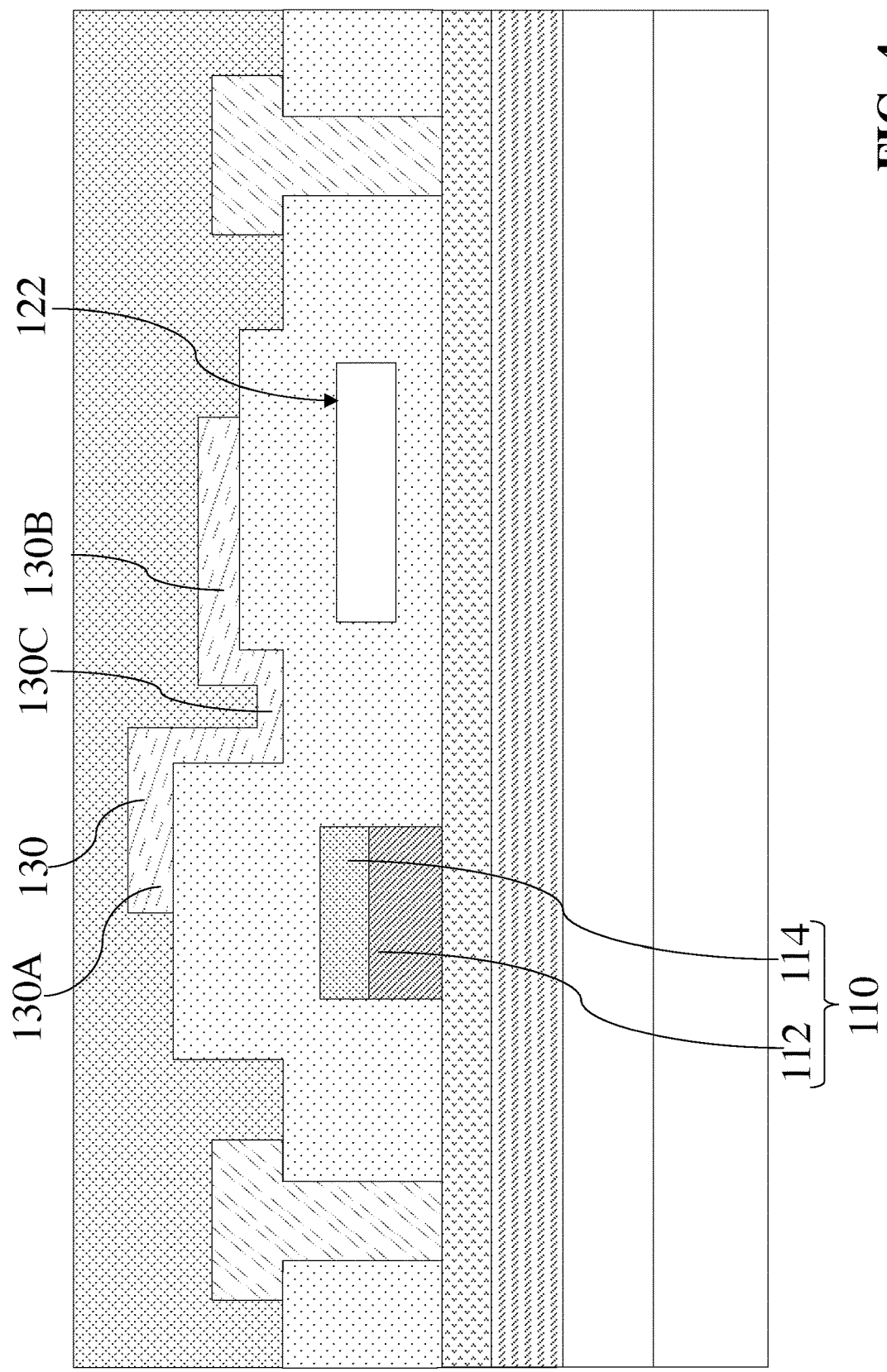
FIG. 4 is a vertical cross-sectional view of a semiconductor device according to some embodiments of the present disclosure.

FIG. 4 is a vertical cross-sectional view of a semiconductor device 100C according to some embodiments of the present disclosure. In the exemplary illustration of FIG. 4, the overall field plate 130 is in a position higher than that of the gate structure 110 and the air gap 122, which means that the portions 130A, 130B and 130C are higher than the gate structure 110 and the air gap 122.

By tuning the process parameters, the configuration that the field plate in combination with the gap can be formed as the structures of FIG. 1B, 3, or 4, which means such a technical solution is compatible with different semiconductor manufacturing process, reducing the complexity.

Figure 5:
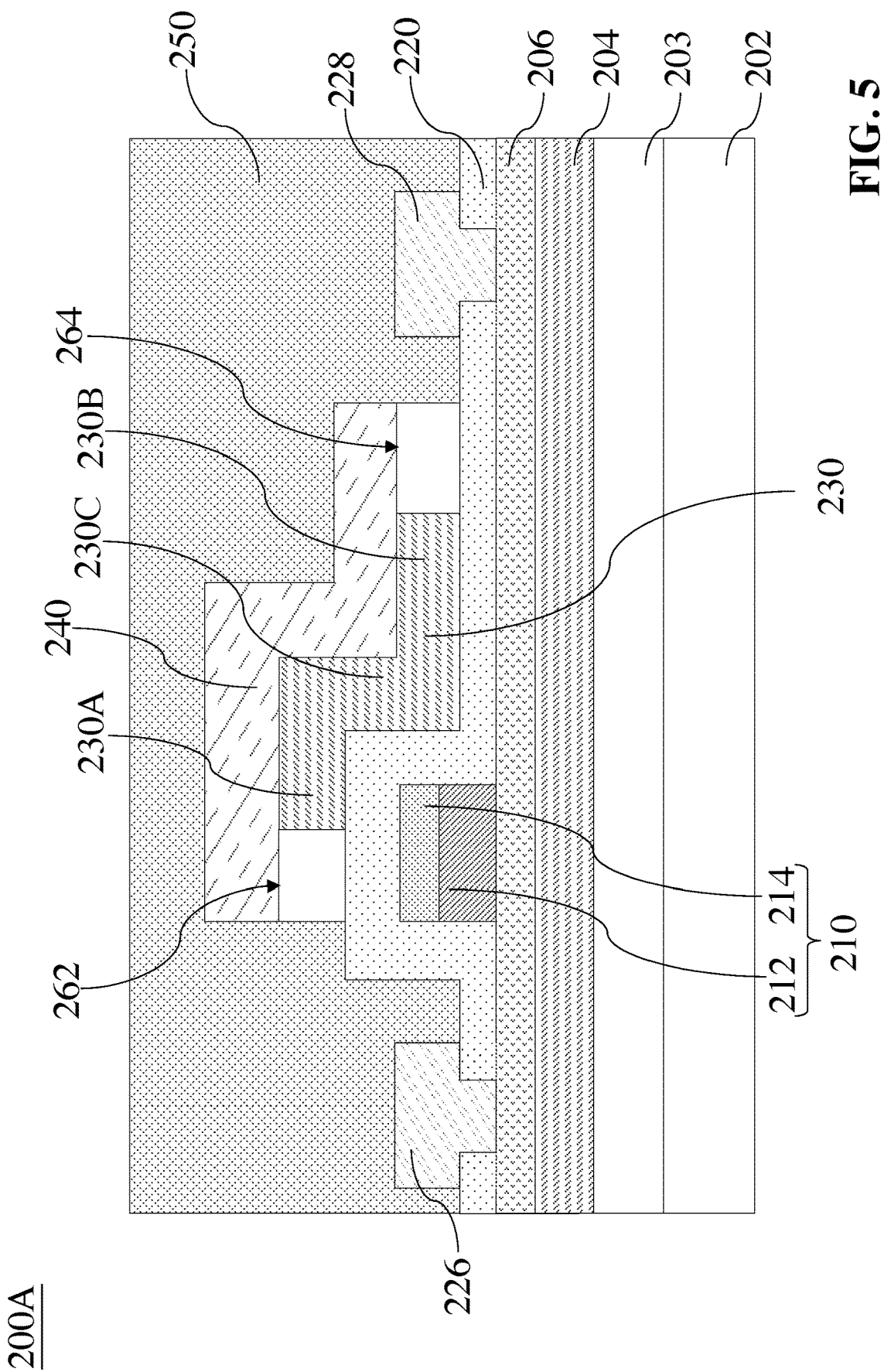
FIG. 5 is a vertical cross-sectional view of a semiconductor device according to some embodiments of the present disclosure.

FIG. 5 is a vertical cross-sectional view of a semiconductor device 200A according to some embodiments of the present disclosure. In the exemplary illustration of FIG. 5, the semiconductor device 200A includes a substrate 202, a buffer layer 203, nitride-based semiconductor layers 204 and 206, a gate structure 210, electrodes 226 and 228, passivation layers 220 and 230, a field plate 240, and a passivation layer 250.

It should be noted that the configuration of the substrate 202, the buffer layer 203, the nitride-based semiconductor layers 204 and 206, the gate structure 210, and the electrodes 226 and 228 is similar to that of the semiconductor device 100A.

In some embodiments, the electrode 226 can serve as a source electrode. In some embodiments, the electrode 226 can serve as a drain electrode. In some embodiments, the electrode 228 can serve as a source electrode. In some embodiments, the electrode 228 can serve as a drain electrode. In some embodiments, each of the electrodes 226 and 228 can be called a S/D electrode, which means they can serve as a source electrode or a drain electrode, depending on the device design.

The passivation layer 220 can be disposed on/over/above and in contact with the nitride-based semiconductor layer 206. The passivation layer 220 covers the gate structure 210 to form a protruding portion. In addition, the passivation layer 220 has no air gaps therein. The passivation layer 220 can formed to be entirely solid.

The passivation layer 230 can be disposed on/over/above the passivation layer 220. The passivation layer 230 can be disposed in a region between the electrodes 226 and 228. The passivation layer 230 extends over the protruding portion of the passivation layer 220 and thus is in a position higher than the gate structure 210. The passivation layer 230 can form a step profile. In some embodiments, the passivation layer 220 can include $SiN_x$, $SiO_x$, $Si_3N_4$, SiON, SiC, SiBN, SiCBN, oxides, nitrides, black diamond (BD), or any combination of the aforesaid materials. The passivation layer 230 can include $SiN_x$, $SiO_x$, $Si_3N_4$, SiON, SiC, SiBN, SiCBN, oxides, nitrides, black diamond (BD), or any combination of the aforesaid materials that is different from the passivation layer 220. Accordingly, the passivation layer 220 can have an etching rate different from the passivation layer 230.

The field plate 240 is disposed on/over/above the passivation layer 230. The field plate 240 can be disposed in a region between the electrodes 226 and 228. The field plate 240 is in contact with the passivation layer 230. The field plate 240 is conformal with the passivation layer 230. The field plate 240 spans across the passivation layer 230, which means that the passivation layer 230 is shorter/narrower than the field plate 240.

The passivation layer 250 is disposed on/over/above and covers the passivation layers 220, 230, the field plate 240 and electrodes 226 and 228. Since the passivation layer 230 is shorter/narrower than the field plate 240, air gaps 262 and 264 are formed at opposite end portions 230A and 230B of the passivation layer 230 and above the passivation layer 220. The air gaps 262 and 264 are separated from each other.

The passivation layers 220, 230, 250, and the field plate 240 can collectively define the boundaries of the enclosed air gaps 262 and 264. That is, the passivation layers 220, 230, 250 and the field plate 240 contact the enclosed air gaps 262 and 264, and thus each of the air gaps 262 and 264 is embedded between the different element layers. For example, the air gap 262 is between the gate structure 210 and the field plate 240. The air gap 264 is between the gate structure 210 and the electrode 228. Furthermore, as the passivation layers 220, 230, and 250 have different dielectric materials, each of the air gaps 262 and 264 is surrounded by different dielectric materials. As such, each of the air gaps 262 and 264 is defined by a combination of at least one conductive material and different dielectric materials.

The passivation layer 230 can further include a portion 230C between the opposite portions 230A and 230B. The end portion 230A is close to the electrode 226 and is in contact with the protruding portion of the passivation layer 220. The end portion 230A contacts the air gap 262. The end portion 230B is close to the electrode 228. The end portion 230B contacts the air gap 264. Accordingly, the air gap 262 is on the protruding portion of the passivation layer 220 and thus in a position higher than the air gap 264. The portion 230C connects to the portions 230A and 230B.

The end portion 230A of the passivation layer 230 is spaced apart from the passivation layer 250 to define a width of the air gap 262. The end portion 230B of the passivation layer 230 is spaced apart from the passivation layer 250 to define a width of the air gap 264. The widths od the air gaps 262 and 264 are adjustable.

The dielectric of the passivation layer 250 can extend to a region between the air gap 262 and the electrode 226 as well as a region between the air gap 264 and the electrode 228.

Since the enclosed air gaps 262 and 264 are buried/embedded among the passivation layers 220, 230 and 250 and the field plate 240. The air gaps 262 and 264 can reduce the electric field at the two opposite edges of the field plate 240, so as to achieve a higher breakdown electric field. Furthermore, the air gaps 262 and 264 are located under the two opposite end portions of the field plate 240, respectively, balancing the electric fields at the end portions of the field plate 240. As such, the semiconductor device 200A can achieve an uniform electric field distribution with a smaller number of field plates.

Additionally, the introduction of the air gap 262 between the field plate 240 and the gate electrode 212 may lead to a reduction in the parasitic capacitance therebetween. Similarly, the parasitic capacitance between the gate electrode 214 and the electrode 228 can be eliminated due to introduction of the air gap 264. Thus, the maximum operating frequency of the semiconductor device 200A can be allowed to get higher.

Moreover, considering the parasitic capacitance generated between any two of the conductive layers, at least one enclosed air gap can be introduced into the passivation layer 220, as afore-mentioned (e.g., FIG. 1B), thereby alleviating the negative effect of the parasitic capacitance.

Different stages of a method for manufacturing the semiconductor device 200A are shown in FIG. 6A, FIG. 6B and FIG. 6C as described below. For clarity, manufacturing stages of some element layers are omitted, such as the electrodes 226 and 228 and the passivation layer 250.

Referring to FIG. 6A, a substrate 202 is provided. A buffer layer 203, a nitride-based semiconductor layer 204, a nitride-based semiconductor layer 206, a doped nitride-based semiconductor 212, a gate electrode 214, an intermediate passivation layer 230', and a blanket conductive layer 240' can be formed over the substrate 202 in sequence by using deposition techniques.

To be more specific, the buffer layer 203 is formed on the substrate 202. The nitride-based semiconductor layer 204 is formed on the buffer layer 203. The nitride-based semiconductor layer 206 is formed on the nitride-based semiconductor layer 204. The doped III-V semiconductor layer 212 is formed on the nitride-based semiconductor layer 206. The gate electrode 214 is formed on the doped III-V semiconductor layer 212. The intermediate passivation layer 230' is formed on the nitride-based semiconductor layer 206 to cover the doped III-V semiconductor layer 212, the gate electrode 214, and the nitride-based semiconductor layer 206. The blanket conductive layer 240' is formed on the intermediate passivation layer 230'.

The formation of the doped III-V semiconductor layer 212 and the gate electrode 214 further includes a patterning process. In some embodiments, the deposition techniques can form a blanket layer, and the patterning process can be performed for removing excess portions thereof. In some embodiments, the patterning process can include photolithography, exposure and development, etching, other suitable processes, or combinations thereof.

Referring to FIG. 6B, the blanket conductive layer 240' is patterned to remove excess portions thereof, so as to form a field plate 240. After patterning, a part of a top surface of the intermediate passivation layer 230' is exposed.

Referring to FIG. 6C, an etching process is performed on the intermediate passivation layer 230' to remove the excess portions thereof so as to become narrower than the field plate 240. Specifically, the etching process includes a selective etching process. In some embodiments, the materials of the passivation layers 220 and 230 are different. During the etching process, when an etchant is applied to the passivation layers 220 and 230, the etching rate of the passivation layer 220 is different from that of the passivation layer 230 with respect to the same etchant. As such, the intermediate passivation layer 230' can become a passivation layer 230 narrower than the field plate 240, and the passivation layer 220 substantially remains the same. The formed passivation layer 230 has an end surface directly above the gate structure 210. In the end of this stage, a part of boundaries of air gaps 262 and 264 are preliminarily/partially defined.

Thereafter, a passivation layer 250 can be formed to cover the field plate 240 and the passivation layer 220. The two opposite end surfaces of the field plate 240 are covered by the passivation layer 250. As such, all of the boundaries of the air gaps 262 and 264 can be defined, obtaining the configuration of the semiconductor device 200A as shown in FIG. 5.

Figure 7:
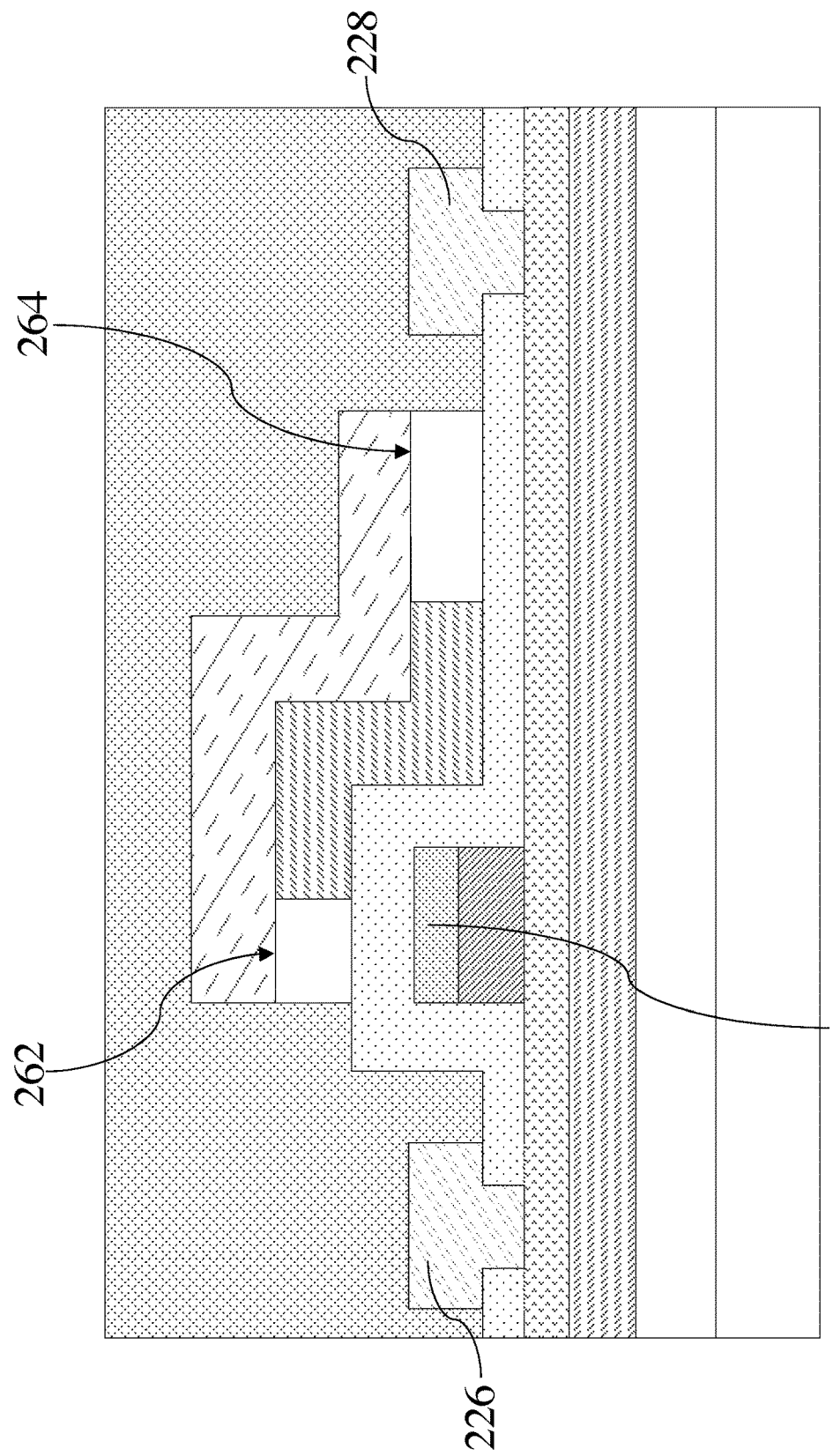
FIG. 7 is a vertical cross-sectional view of a semiconductor device according to some embodiments of the present disclosure.

FIG. 7 is a vertical cross-sectional view of a semiconductor device 200B according to some embodiments of the present disclosure. In the exemplary illustration of FIG. 7, the width of the air gap 262 is different from that of the air gap 264. For example, the width of the air gap 262 is less than that of the air gap 264. Such a configuration can comply with the requirement that the gate electrode 214 be closer to the electrode 226 than the electrode 228. For example, the requirement may be compatible with that a electrode will work at a high voltage.

Figure 8:
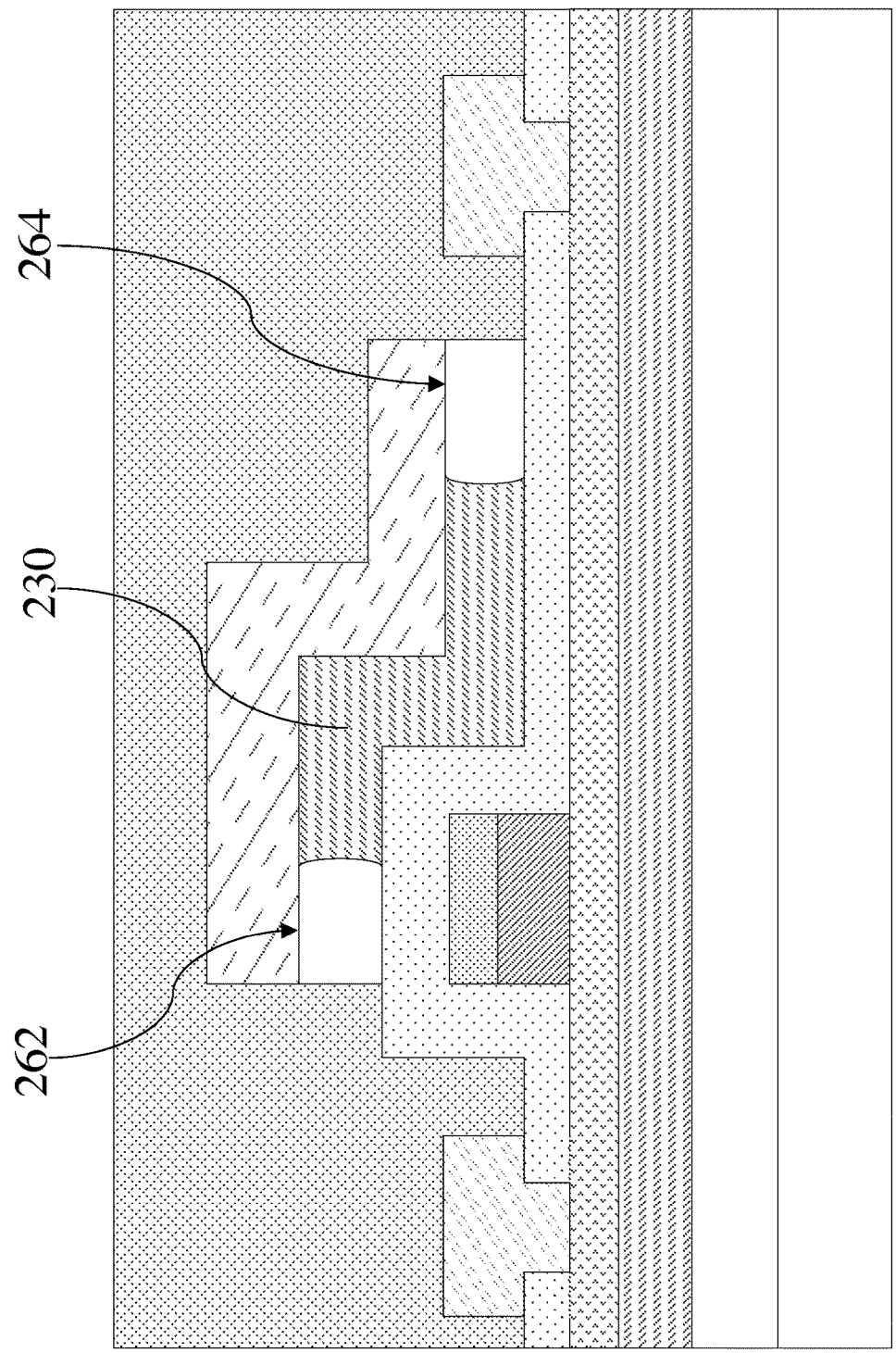
FIG. 8 is a vertical cross-sectional view of a semiconductor device according to some embodiments of the present disclosure.

FIG. 8 is a vertical cross-sectional view of a semiconductor device 200C according to some embodiments of the present disclosure. In the exemplary illustration of FIG. 8, the passivation layer 230 has opposite curved sidewalls. As such, a boundary of the air gap 262 is defined as being curved. A boundary of the air gap 264 is defined as being curved.

Figure 9:
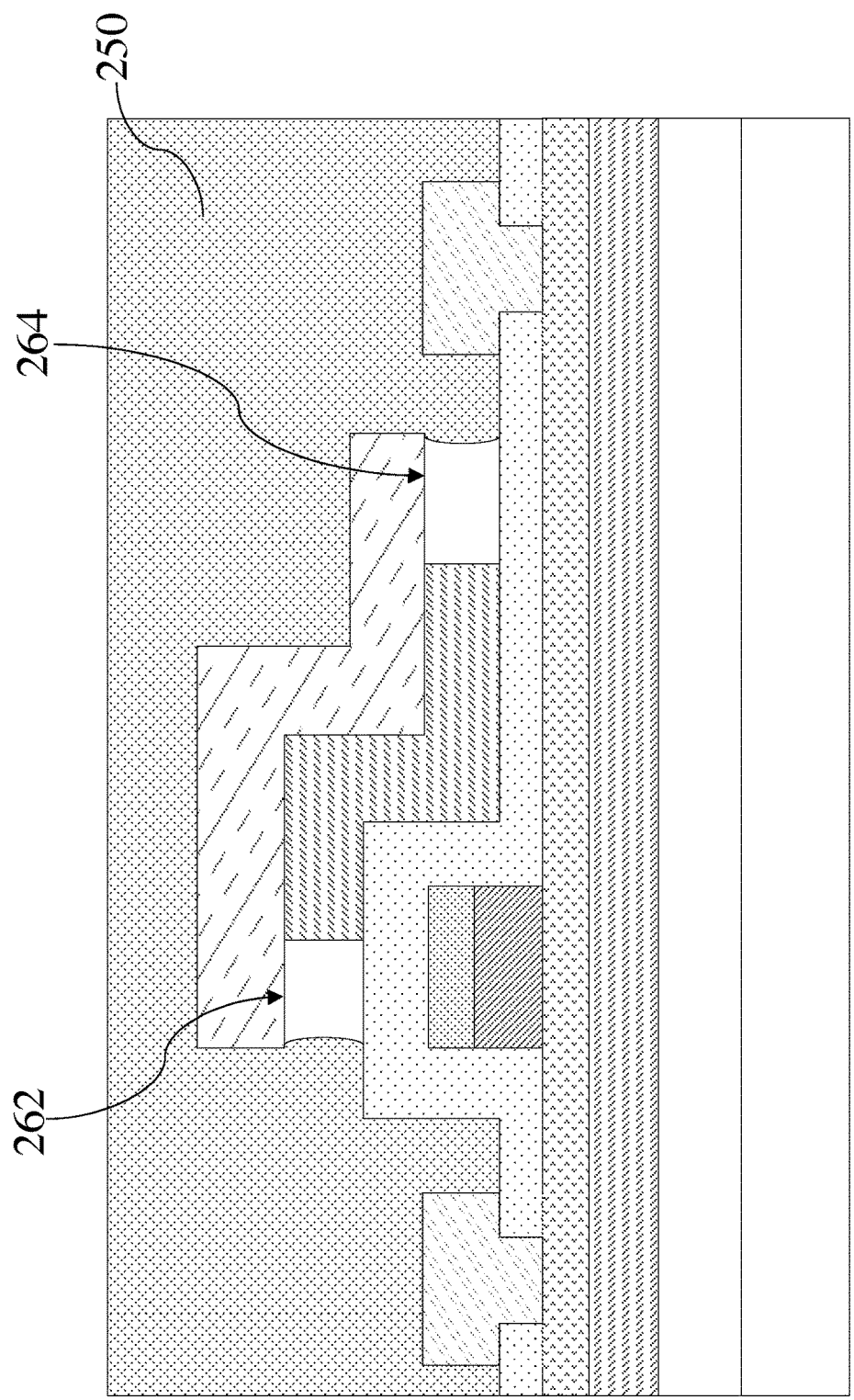
FIG. 9 is a vertical cross-sectional view of a semiconductor device according to some embodiments of the present disclosure.

FIG. 9 is a vertical cross-sectional view of a semiconductor device 200D according to some embodiments of the present disclosure. In the exemplary illustration of FIG. 9, the passivation layer 250 has a pair of sidewalls protruding toward the air gaps 262 and 264. As such, a boundary of the air gap 262 is defined as being curved. A boundary of the air gap 264 is defined as being curved.

By tuning the process parameters, the configuration that the field plate in combination with the gap can be formed as the structures of FIGS. 5, 7, 8, 9, which means such a technical solution is compatible with different semiconductor manufacturing process, reducing the complexity.

By the above configuration, in the embodiments of the present disclosure, the introduction of enclosed air gaps assists the field plate to achieve a moderated electric field distribution and allows the semiconductor device without using excessive field plates, thereby making the manufacturing process thereof simple and reducing the manufacturing costs thereof. Moreover, extra etching steps accompanied with multi field plates design can be avoided. As such, the semiconductor device can have a good reliability and low manufacturing costs.

In addition, since the dielectric constant of the air gaps is lower than any other element layers in the semiconductor device, that is to say, the regions where the air gaps located are low-k regions, the location of the air gap can be designed to a region between the electrodes (i.e., the gate electrode and the source(drain) electrode), or a region between the electrode and the field plate (i.e., the gate/source/drain electrode and the field plate), thereby suppressing the parasitic capacitance therebetween. As such, the operating frequency of the semiconductor device can be enhanced (i.e., be allowed to get higher). The resistance of one or more zones of the 2DEG region directly under the one or more air gaps can be reduced. Accordingly, the semiconductor device of the present disclosure can have good electrical properties.

It should be noted that the above semiconductor devices with different structures in order to meet different electrical requirements.

The embodiments were chosen and described in order to best explain the principles of the disclosure and its practical application, thereby enabling others skilled in the art to understand the disclosure for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A nitride-based semiconductor device, comprising:
   a first nitride-based semiconductor layer;
   a second nitride-based semiconductor layer disposed on the first nitride-based semiconductor layer and having a bandgap greater than a bandgap of the first nitride-based semiconductor layer;
   a source electrode and a drain electrode disposed above the second nitride-based semiconductor layer;
   a gate structure disposed above the second nitride-based semiconductor layer and in a region between the source electrode and the drain electrode;
   a first passivation layer disposed above the second nitride-based semiconductor layer and above the gate structure;
   a second passivation layer disposed above the first passivation layer and in the region between the source electrode and the drain electrode;
   a field plate disposed above the second passivation layer and in the region between the source electrode and the drain electrode; and
   a third passivation layer disposed above the field plate, wherein
   the first passivation layer defines a bottom boundary of at least one enclosed air gap,
   the second passivation layer defines a first side boundary of the at least one enclosed air gap,
   the third passivation layer defines a second side boundary of the at least one enclosed air gap, and
   the field plate defines a top boundary of the at least one enclosed air gap.

2. The semiconductor device of claim 1, wherein the second passivation layer is spaced apart from the third passivation layer to define the at least one enclosed air gap therebetween.

3. The semiconductor device of claim 2, wherein the at least one enclosed air gap is between the gate structure and the field plate.

4. The semiconductor device of claim 2, wherein the at least one enclosed air gap is between the gate structure and the drain electrode.

5. The semiconductor device of claim 2, wherein the at least one enclosed air gap comprises a first enclosed air gap and a second enclosed air gap, wherein the first enclosed air gap is between the gate structure and the field plate and the second enclosed air gap is between the gate structure and the drain electrode and in a position lower than the first enclosed air gap.

6. The semiconductor device of claim 5, wherein the first enclosed air gap has a width less than a width of the second enclosed air gap.

7. The semiconductor device of claim 2, wherein at least one of the first side boundary or the second side boundary of the at least one enclosed air gap is curved.

8. The semiconductor device of claim 2, wherein the third passivation layer comprises a dielectric between the at least one enclosed air gap and the drain electrode.

9. The semiconductor device of claim 2, wherein the third passivation layer covers the source electrode and the drain electrode.

10. The semiconductor device of claim 1, wherein the second passivation layer is shorter than the field plate.

11. The semiconductor device of claim 1, wherein the first passivation layer and the second passivation layer have different materials.

12. The semiconductor device of claim 1, wherein the second passivation layer climbs to a position higher than the gate structure so as to form a step profile.

13. The semiconductor device of claim 12, wherein the field plate is conformal with the second passivation layer.

14. The semiconductor device of claim 1, wherein the at least one enclosed air gap comprises a first enclosed air gap and a second enclosed air gap, and the second passivation layer has two opposite ends directly contacting the first enclosed air gap and the second enclosed air gap, respectively.

15. A method for manufacturing a semiconductor device, comprising:
    forming a first nitride-based semiconductor layer on a substrate;
    forming a second nitride-based semiconductor layer on the first nitride-based semiconductor layer, the second nitride-based semiconductor layer having a bandgap greater than a bandgap of the first nitride-based semiconductor layer;
    forming a source electrode and a drain electrode disposed above the second nitride-based semiconductor layer;
    forming a gate structure above the second nitride-based semiconductor layer and in a region between the source electrode and the drain electrode;
    forming a first passivation layer above the second nitride-based semiconductor layer and above the gate structure;
    forming a second passivation layer above the first passivation layer and in the region between the source electrode and the drain electrode;
    forming a blanket conductive layer on the second passivation layer;
    patterning the blanket conductive layer into a field plate disposed above the second passivation layer and in the region between the source electrode and the drain electrode;
    removing portions of the second passivation layer such that the second passivation layer becomes narrower than the field plate; and
    forming a third passivation layer to cover the first passivation layer and the field plate to form at least one enclosed air gap adjacent with the second passivation layer, wherein
    the first passivation layer defines a bottom boundary of the at least one enclosed air gap,
    the second passivation layer defines a first side boundary of the at least one enclosed air gap, and
    the third passivation layer defines a second side boundary of the at least one enclosed air gap.

16. The method of claim 15, wherein the removing the portions of the second passivation layer is performed by an etching process using an etchant.

17. The method of claim 16, wherein the first passivation layer and the second passivation layer have different materials such that the first passivation layer and the second passivation layer have different etching rate with respect to the etchant.

18. The method of claim 15, wherein the removing the portions of the second passivation layer is performed such that the second passivation layer has an end surface directly above the gate structure.

19. The method of claim 15, wherein the forming the third passivation layer is performed such that two opposite end surfaces of the field plate are covered by the third passivation layer.

* * * * *